(12) United States Patent
Morgan et al.

(10) Patent No.: US 7,833,026 B1
(45) Date of Patent: Nov. 16, 2010

(54) ELECTRICAL CONNECTOR SYSTEM

(75) Inventors: Chad William Morgan, Woolwich Township, NJ (US); David Wayne Helster, Dauphin, PA (US); Michael William Woodford, Hershey, PA (US)

(73) Assignee: Tyco Electronics Corporation, Berwyn, PA (US)

(*) Notice: Subject to any disclaimer, the term of this patent is extended or adjusted under 35 U.S.C. 154(b) by 0 days.

(21) Appl. No.: 12/729,889

(22) Filed: Mar. 23, 2010

(51) Int. Cl.
*H01R 4/66* (2006.01)
(52) U.S. Cl. .................. 439/108; 439/83; 439/79; 439/65; 439/607.05; 439/941
(58) Field of Classification Search .................. 439/65, 439/79, 83, 108, 607.05, 924.1, 941
See application file for complete search history.

(56) References Cited

U.S. PATENT DOCUMENTS

| | | | |
|---|---|---|---|
| 5,543,586 A | | 8/1996 | Crane, Jr. et al. |
| 6,817,870 B1 | * | 11/2004 | Kwong et al. ............... 439/74 |
| 2007/0169961 A1 | | 7/2007 | Kwong et al. |
| 2008/0176452 A1 | * | 7/2008 | Fedder et al. ............... 439/638 |
| 2008/0207015 A1 | | 8/2008 | Sueyoshi |
| 2009/0061684 A1 | * | 3/2009 | Cohen et al. ............... 439/608 |
| 2010/0015822 A1 | * | 1/2010 | Morgan et al. ............... 439/83 |

\* cited by examiner

*Primary Examiner*—Tho D Ta

(57) ABSTRACT

An electrical connector assembly includes a circuit board having vias each extending at least partially through the circuit board along parallel via axes and an electrical connector configured to be mounted on the circuit board. The electrical connector includes a plurality of variable depth signal terminals configured to extend different depths into respective vias of the circuit board. The signal terminals each have a terminal axis, and the signal terminals are arranged in pairs carrying differential pair signals. The signal terminals of each pair extend to the same depth in the respective vias of the circuit board. The terminal axes of the signal terminals of each pair are offset with respect to the corresponding via axes along a majority of the signal terminals within the vias.

20 Claims, 5 Drawing Sheets

ELECTRICAL CONNECTOR SYSTEM

BACKGROUND OF THE INVENTION

The subject matter described and/or illustrated herein relates generally to electrical connector systems and, more particularly, to electrical connectors that are mounted on circuit boards.

To meet digital multi-media demands, higher data throughput is often desired for current digital communications equipment. Electrical connectors that interconnect circuit boards must therefore handle ever increasing signal speeds at ever increasing signal densities. One application environment that uses such electrical connectors is in high speed, differential electrical connectors, such as those common in the telecommunications or computing environments. In a traditional approach, two circuit boards are interconnected with one another in a backplane and a daughter board configuration. However, at the footprints of the circuit boards where the electrical connectors connect thereto it may be difficult to improve density while maintaining electrical performance and/or reasonable manufacturing cost. For example, vias within the circuit boards must be large enough to plate for a given circuit board thickness, but must also be far enough apart from one another to maintain electrical performance (e.g., impedance and/or noise). To increase the number of vias, and therefore increase the density of the circuit board footprint, the vias can be smaller and/or closer together. However, moving the vias closer together degrades the electrical performance of the circuit board footprint, while decreasing the size of the vias may increase manufacturing costs by increasing the difficulty of plating the vias. Circuit board footprints are currently a bottleneck for achieving higher system densities and/or higher system speeds.

Different known approaches have been used to improve the electrical performance and/or density of circuit board footprints. For example, careful via placement, anti-pad optimization, and counter boring of via stubs have been used to improve circuit board footprints. However, to achieve higher system densities and speed, further improvement of circuit board footprints and connections to the circuit boards must be made over known approaches.

There is a need for an electrical connector that enables improvement of the density and/or electrical performance of circuit board footprints to achieve higher system densities and/or higher system speeds.

BRIEF DESCRIPTION OF THE INVENTION

In one embodiment, an electrical connector assembly is provided that includes a circuit board having vias each extending at least partially through the circuit board along parallel via axes and an electrical connector mounted on the circuit board. The electrical connector includes a plurality of variable depth signal terminals configured to extend different depths into respective vias of the circuit board. The signal terminals each have a terminal axis, and the signal terminals are arranged in pairs carrying differential pair signals. The signal terminals of each pair extend to the same depth in the respective vias of the circuit board. The terminal axes of the signal terminals of each pair are offset with respect to the corresponding via axes along a majority of the signal terminals within the vias.

In another embodiment, an electrical connector assembly is provided including a circuit board having vias each extending at least partially through the circuit board along parallel via axes, with each via having a mounting pad. An electrical connector is mounted on the circuit board. The electrical connector includes a housing having a mounting face configured to be mounted along the circuit board and a plurality of signal terminals held by the housing. The signal terminals each include mounting contacts extending outward from the mounting face of the housing that are received in respective vias of the circuit board. The mounting contacts each have a mounting portion engaging the mounting pad within the corresponding via and each have a transition portion extending between the mounting face of the housing and the mounting portion of the mounting contact. The transition portion is offset with respect to the mounting portion.

In a further embodiment, an electrical connector for mounting on a circuit board having vias is provided. The electrical connector includes a housing having a mounting face configured to be mounted along the circuit board and a plurality of variable depth signal terminals held by the housing. The signal terminals are configured to extend different depths into respective vias of the circuit board and are arranged in pairs carrying differential pair signals. The signal terminals of each pair extend to the same depth in the respective vias of the circuit board. The signal terminals each have a terminal axis defined at a cross-sectional center of the signal terminals along the length of the signal terminals. The signal terminals include mounting contacts extending outward from the mounting face of the housing, where each mounting contact has a mounting portion and a transition portion extending between the mounting face of the housing and the mounting portion of the mounting contact. The terminal axis of the transition portion is offset with respect to the terminal axis of the mounting portion.

DETAILED DESCRIPTION OF THE INVENTION

Figure 1:
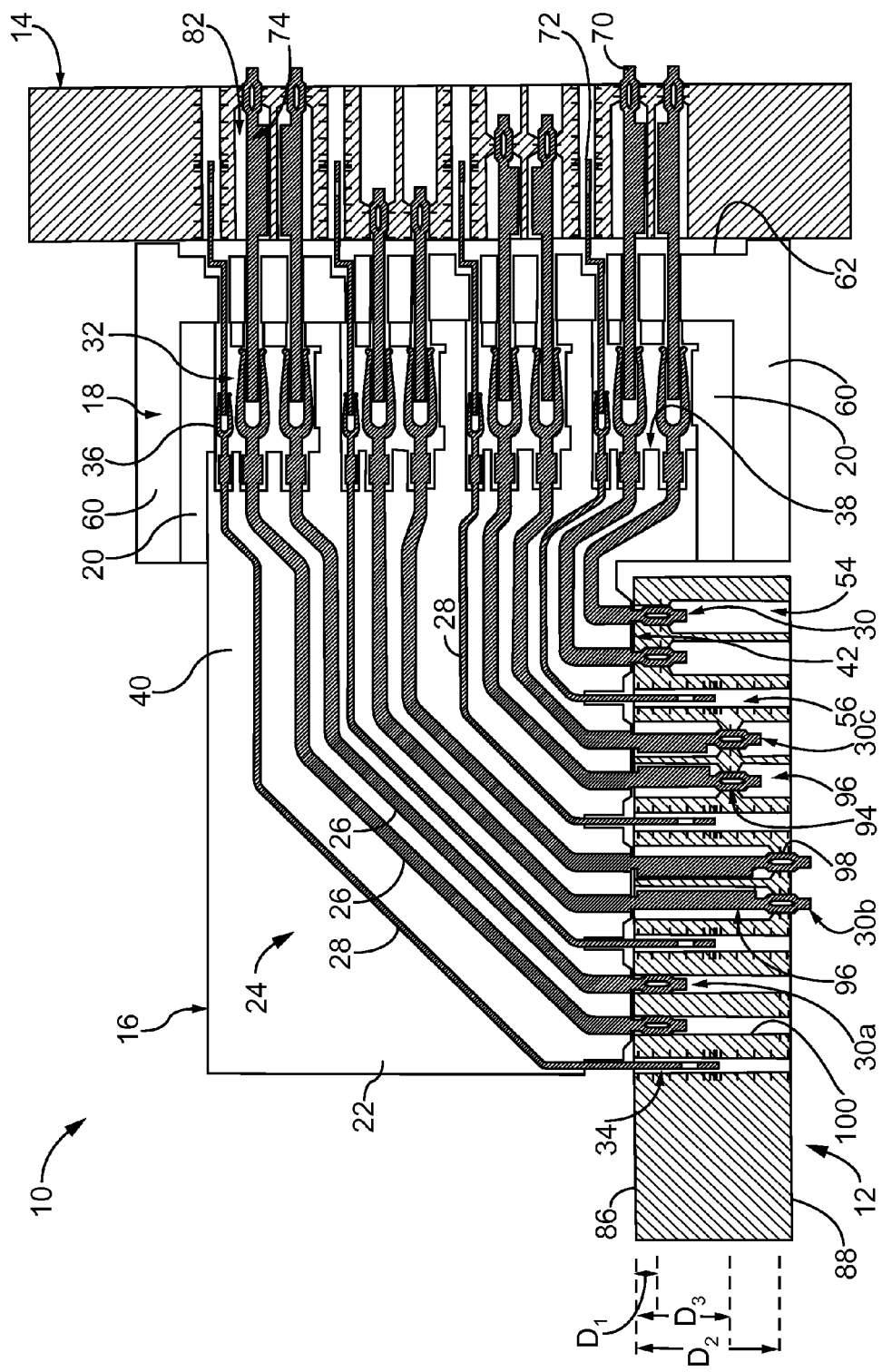
FIG. 1 is a cross-sectional view of an exemplary embodiment of an electrical connector assembly illustrating electrical connectors mounted to circuit boards.

FIG. 1 is a cross-sectional view of an exemplary embodiment of an electrical connector assembly 10. The connector assembly 10 includes a pair of circuit boards 12 and 14, a receptacle connector 16, and a header connector 18. The receptacle connector 16 is mounted on the circuit board 12, and the header connector 18 is mounted on the circuit board 14. The receptacle connector 16 and the header connector 18 are connected together to electrically connect the circuit boards 12 and 14. In the exemplary embodiment of FIG. 1, the receptacle connector 16 and the header connector 18 are oriented such that the connectors 16 and 18 form an approximate right-angle connection between the circuit boards 12 and 14. Alternatively, the receptacle connector 16 and the header connector 18 may be oriented such that the circuit boards 12 and 14 are oriented at any other angle relative to each other, such as, but not limited to, approximately parallel. The subject matter herein may be described with reference to either the circuit board 12 or the circuit board 14, however it is realized that features or elements described relative to one of the circuit boards 12 or 14 may apply equally to the other circuit board 12 or 14. Similarly, the subject matter herein may be described with reference to either the receptacle connector 16 or the header connector 18, however it is realized that features or elements described relative to one of the receptacle connector 16 or the header connector 18 may apply equally to the other of the receptacle connector 16 or the header connector 18.

The receptacle connector 16 includes a dielectric housing 20 that, in the illustrated embodiment, holds a plurality of parallel contact modules 22 (one of which is illustrated in FIG. 1). The contact module 22 includes a contact lead frame 24 that includes a plurality of signal terminals 26 and/or a plurality of ground terminals 28. Each signal terminal 26 includes a mounting contact 30 at one end portion of the signal terminal 26 and a mating contact 32 at an opposite end portion of the signal terminal 26. Similarly, each ground terminal 28 includes a mounting contact 34 at one end portion of the ground terminal 28 and a mating contact 36 at an opposite end portion of the ground terminal 28. The mating contacts 32 and 36 extend outward from, and along, a mating face 38 of the contact module 22. The signal terminals 26 are optionally arranged in differential pairs.

Each contact module 22 includes a dielectric contact module housing 40 that holds the corresponding lead frame 24. Each contact module housing 40 includes the mating face 38 and a mounting face 42. In the illustrated embodiment, the mating face 38 is approximately perpendicular to the mounting face 42. However, the mating face 38 and mounting face 42 may be oriented at any other angle relative to each other, such as, but not limited to, approximately parallel. The mating face 38 of each contact module is received in the housing 20 and is configured to mate with corresponding mating contacts of the header connector 18.

The mounting face 42 of each of the contact modules 22 is configured for mounting on a circuit board, such as, but not limited to, the circuit board 12. The mounting contacts 30 and 34 extend outward from, and along, the mounting face 42 of the contact modules 22 for mechanical and electrical connection to the circuit board 12. Specifically, each of the mounting contacts 30 and 34 is configured to be received within a corresponding via 54 and 56, respectively, within the circuit board 12.

In an exemplary embodiment, the signal terminals 26 constitute variable depth connection terminals, where some of the mounting contacts 30 extend different lengths from the mounting face 42 than others of the mounting contacts 30 (whether the others are on the same contact module 22 or a different contact module 22) to different mating depths. For example, a differential pair 30a of the mounting contacts 30 extends to a mating depth $D_1$ from the mounting face 42, a differential pair 30b of the mounting contacts 30 extends to a mating depth $D_2$ from the mounting face 42, and a differential pair 30c of the mounting contacts 30 extends to a mating depth $D_3$ from the mounting face 42. The depths $D_1$-$D_3$ are each different. Any of the mounting contacts 30 of the receptacle connector 16 may have a different length, and thus a different mating depth, from the corresponding mounting face 42 than any other mounting contact 30 of the receptacle connector 16. The pattern of the lengths of the mounting contacts 30 shown herein is meant as exemplary only.

The header connector 18 includes a dielectric housing 60 that receives the receptacle connector 16 and a mounting face 62 for mounting the header connector 18 to a circuit board, such as, but not limited to, the circuit board 14. The housing 60 holds a plurality of signal terminals 70 and a plurality of ground terminals 72. The signal terminals 70 are optionally arranged in differential pairs, as the signal terminals 70 are shown in the illustrated embodiment.

Each signal terminal 70 includes a mounting contact 74 at one end portion of the signal terminal 70. Each of the mounting contacts 74 is configured to be received within a corresponding via 82 within the circuit board 14. Similar to the mounting contacts 30 of the receptacle connector 16, some of the mounting contacts 74 of the signal terminals 70 extend different lengths from the mounting face 62 of the header connector 18 than others of the mounting contacts 74.

The circuit board 12 includes a substrate having a pair of opposite upper and lower surfaces 86 and 88. The mounting face 42 of each of the contact modules 22 is configured to be mounted along the upper surface 86 such that the receptacle connector 16 is mounted on the upper surface 86 of the circuit board 12. The circuit board 12 includes the plurality of vias 54 and 56 that receive the mounting contacts 30 and 34, respectively, of the respective signal and ground terminals 26 and 28. The circuit board 14 may be formed in a similar manner as the circuit board 12.

The vias 54 each include a smaller diameter portion 94 and one or more larger diameter portions 96. The smaller diameter portions 94 each include an electrical conductor 98 on a surface 100 defining the smaller diameter portion 94 of the via 54. Each electrical conductor 98 defines an electrical contact portion for electrical connection with a corresponding one of the mounting contacts 30 of the signal terminals 26. The electrical conductor 98 of each via 54 is electrically connected to a signal trace (not shown) of the circuit board 12. For example, the electrical conductors 98 of the smaller diameter portions 94 of the vias 54 are each electrically connected to a different signal trace on one of the layers of the circuit board 12.

The electrical conductors 98 of some of the vias 54 are located at respective different depths within the corresponding via 54 relative to the surface 86 of the circuit board 12. Each electrical conductor 98 may be formed by any suitable method, process, means, and/or the like, such as, but not limited to, plating and/or the like. Each of the vias 54 may be formed using any suitable method, process, means, and/or the like. For example, each of the vias 54 may be formed by forming an opening within the circuit board 12 to define the surface 100 of the smaller diameter portion 94, forming the electrical conductor 98 on the surface 100, and thereafter boring through the circuit board 12 to define the larger diameter portion(s) 96. The boring operation will remove the surface 100 and the electrical conductor 98 from the entirety of the via 54 except for the smaller diameter portion 94.

When the receptacle connector 16 is mounted on the circuit board 12, the mounting contacts 30 are each received within the corresponding via 54, such that the mounting contacts 30 are electrically connected to the respective electrical conductor 98. Some of the mounting contacts 30 of the signal terminals 26 extend different depths, relative to the circuit board surface 86, into the corresponding via 54 than others of the mounting contacts 30 (whether the others are on the same contact module 22 or a different contact module 22). Although the mounting contacts 30 are shown herein as press-fit contacts, the mounting contacts 30 may each be any suitable type of electrical contact that enables the mounting contacts 30 to function as described herein.

Figure 2:
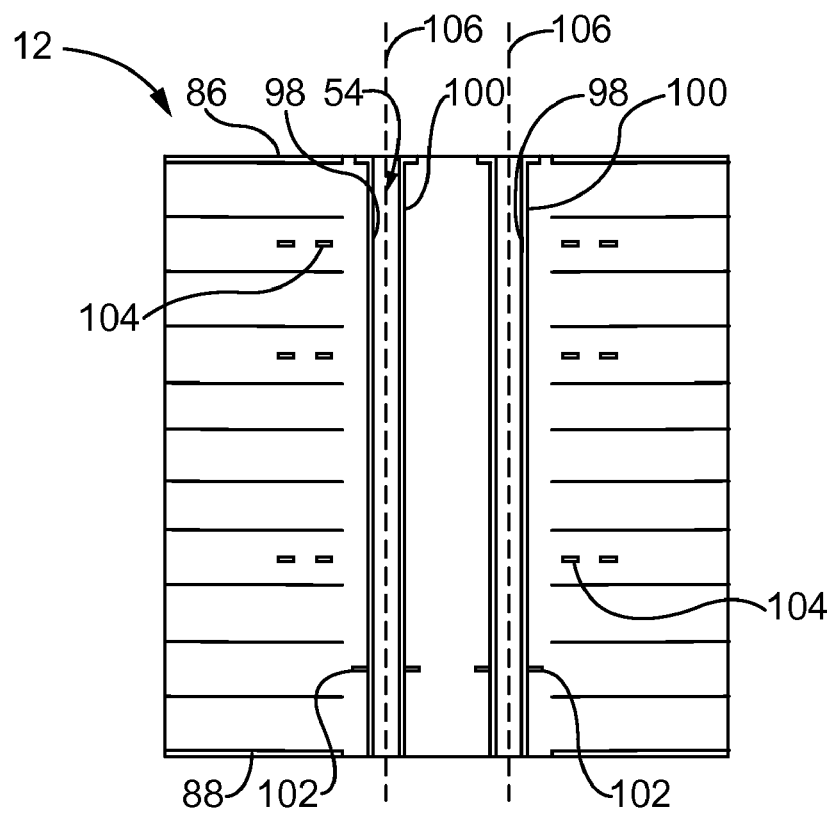
FIG. 2 is a partial cut-away view of one of the circuit boards during one stage of manufacture.

FIG. 2 is a partial cut-away view of the circuit board 12 during one stage of manufacture. The circuit board 12 includes a pair of the vias 54 extending through the layers of the circuit board 12 between the top and bottom surfaces 86, 88. The thickness of the circuit board 12 is a function of the number of layers, and the number of layers may depend, at least in part, on the number of components being connected to the circuit board 12. For example, a backplane circuit board may be substantially thicker than a daughtercard circuit board because many more electrical components are connected to the backplane circuit board as compared to the daughtercard circuit board, thus more layers are required to route the traces through the board.

In an exemplary embodiment, the vias 54 are formed by boring through the circuit board 12 at predetermined locations, such that the bore passes though corresponding mounting pads 102 in, or on, one of the layers. The mounting pads 102 are connected to corresponding signal traces (not shown) routed through the circuit board 12. The mounting pads 102 define the connection point between the receptacle connector 16 (shown in FIG. 1) and the circuit board 12. Boring through the circuit board 12 forms the surface 100, which is cylindrical and has a certain diameter. The thickness of the circuit board 12 may affect the diameter of the vias 54. For example, it is desirable to maintain a certain aspect ratio of circuit board thickness to via diameter in order to facilitate adequate plating of the via 54. If the diameters of the vias 54 are too small, as compared to the thickness of the circuit board 12, then the via 54 cannot be properly plated.

Once the vias 54 are bored, the surfaces 100 are plated, thus forming the electrical conductor 98. The plating process deposits a metal surface on the surface 100, which engages the mounting pads 102, thus creating an electrical connection between the mounting pads 102 and the electrical conductors 98. When the mounting contacts 30 (shown in FIG. 1) engage the electrical conductors 98, an electrical path is created between the mounting contacts 30 and the mounting pads 102.

Having the electrical conductors 98 in proximity to other traces 104 routed through the various layers of the circuit board 12 has a negative impact on the electrical performance of the system. For example, signal degradation due to cross-talk between the electrical conductors 98 and the traces 104 may result. The effects of the signal degradation may be impacted by the characteristics of the signals being transmitted by the electrical conductors 98 and/or the traces 104, such as, but not limited to, the signal transmission speed. In an exemplary embodiment, at least a portion of each electrical conductor 98 is removed during a counterboring process to reduce the length of the electrical conductor 98 along a via axis 106 thereof.

Figure 3:
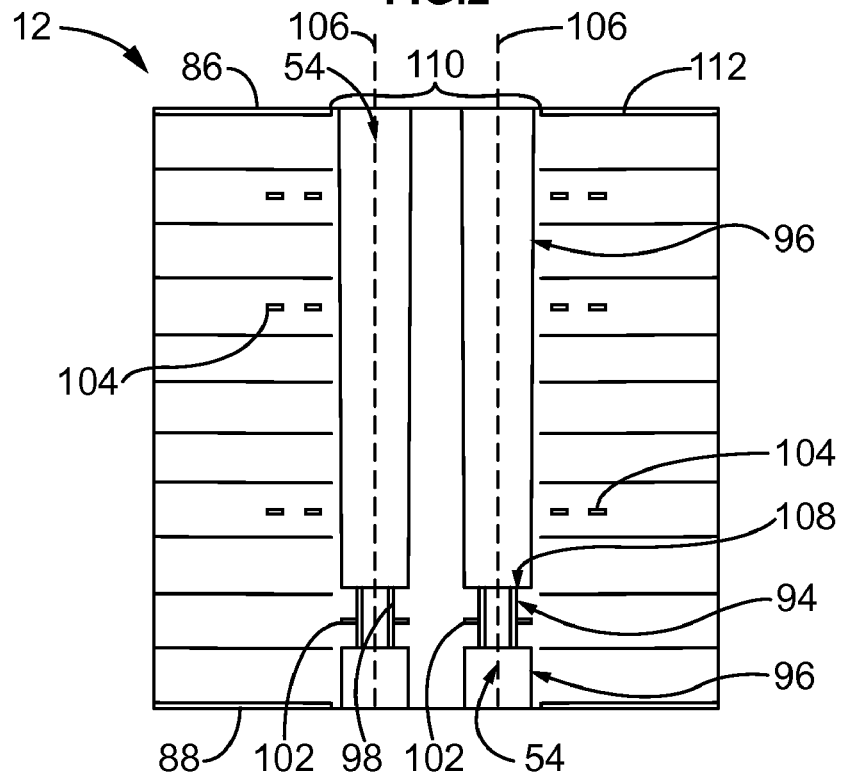
FIG. 3 is a partial cut-away view of the circuit board shown in FIG. 2 during another stage of manufacture.

FIG. 3 is a partial cut-away view of the circuit board 12 during another stage of manufacture after the counterboring operation. In the illustrated embodiment, the vias 54 are counterbored from the top surface 86 and from the bottom surface 88. The vias 54 are counterbored to the vicinity of the mounting pads 102, leaving a relatively short electrical conductor 98. The counterboring reduces the cross-talk with neighboring traces 104. Counterboring from the top surface 86 and the bottom surface 88 may not be possible for each via 54. For example, vias 54 having electrical conductors 98 at or near one of the upper layers may not have any counterboring from the upper surface 86. Similarly, vias 54 having electrical conductors 98 at or near one of the bottom layers may not have any counterboring from the lower surface 88.

Figure 4:
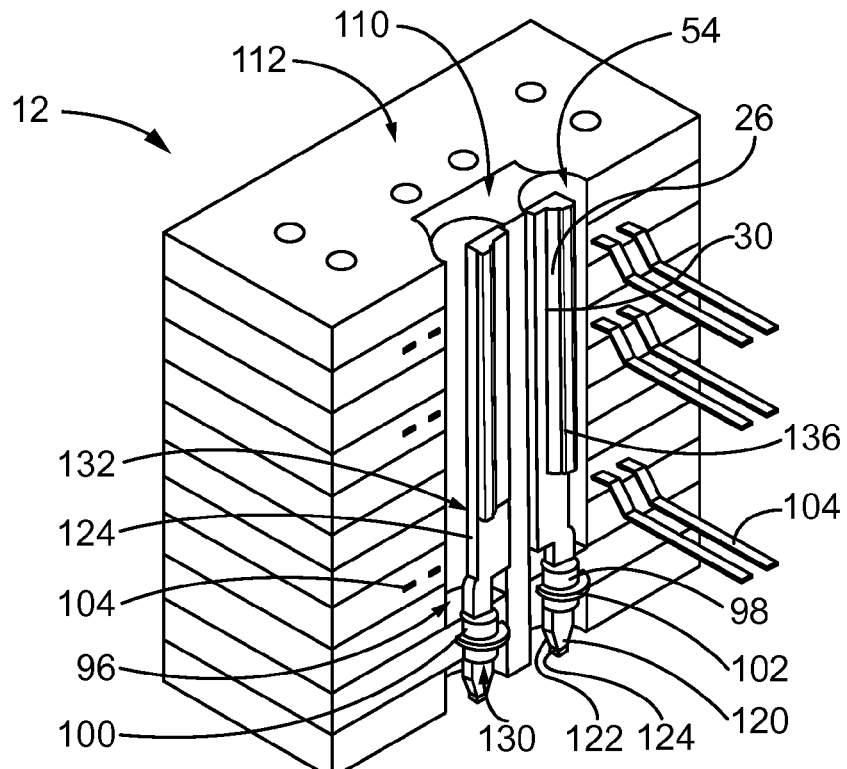
FIG. 4 is a partial cut-away view of the circuit board shown in FIG. 2 illustrating signal terminals mounted to the circuit board.

The counterboring defines the larger diameter portions 96 for each via 54. The portion of the via 54 not counterbored defines the smaller diameter portion 94. A shoulder 108 is created at the interface between the upper larger diameter portion 96 and the smaller diameter portion 94. Optionally, the shoulder 108 may be tapered downward toward the via axis 106. In an exemplary embodiment, the diameter of the smaller diameter portion 94 is approximately half the diameter of the larger diameter portion 96. Having a large diameter for the larger diameter portions 96 introduces air in the via 54 along the via axis 106 around the signal terminal 26 (shown in FIG. 4). The air affects interpair and intrapair coupling as described in further detail below, such as by lowering cross-talk with neighboring traces 104 and/or raising impedance of the signal terminals 26. The diameter of the larger diameter portion 96 may be restricted by other components of the circuit board 12, such as the proximity of neighboring traces 104 to the vias 54 and/or the spacing between the vias 54 themselves. The diameter of the larger diameter portion 96 may be restricted by a size of one or more opening(s) 110, also known as an antipad, in one or more ground layer(s) 112. The opening 110 and the ground layer 112 are also illustrated in FIG. 4. The ground layer 112 is designed to be a certain distance from the mounting contacts 30 (shown in FIG. 1) to control impedance.

Figure 5:
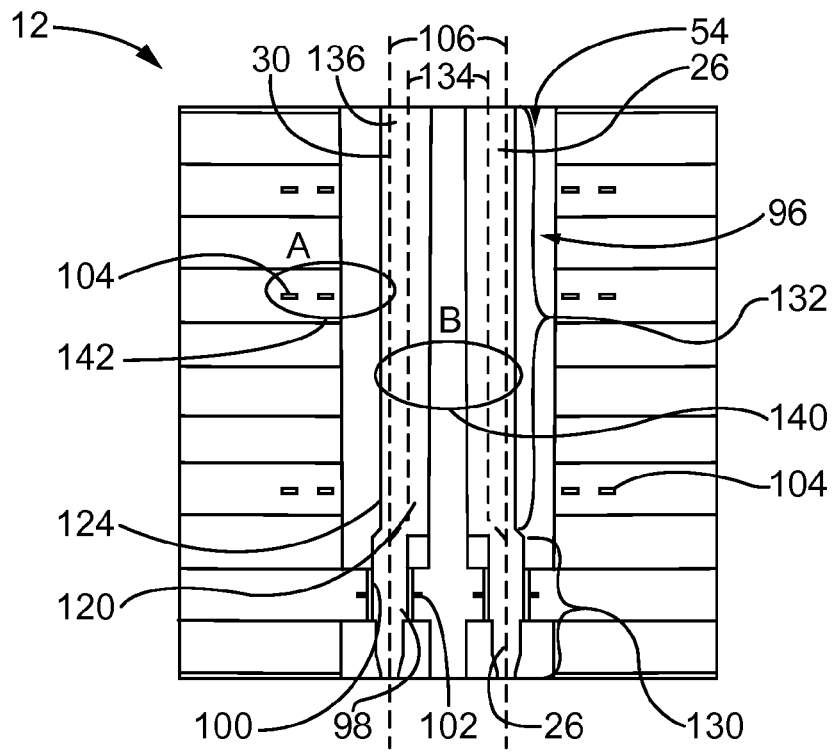
FIG. 5 is a side view of the circuit board and signal terminals shown in FIG. 4.

FIG. 4 is a partial cut-away view of the circuit board 12 illustrating the signal terminals 26 connected to the circuit board 12. FIG. 5 is a side view of the circuit board 12 and signal terminals 26. The mounting contacts 30 of the signal terminals 26 are the only portions of the signal terminals 26 illustrated in FIGS. 4 and 5.

The mounting contacts 30 form part of the lead frame 24 (shown in FIG. 1), and are formed integral with the signal terminals 26 thereof. In an exemplary embodiment, the lead frame 24 is stamped and formed to define the signal terminals 26. When stamped, the signal terminals 26 are separated from one another and are generally co-planar with one another. The planar sides of the stock of material used to form the lead frame 24 define a first side 120 and a second side 122 of the signal terminals 26, which are parallel to one another. Cut sides 124 extend between the first and second sides 120, 122, which are defined during the stamping process by shearing off the unused stock material. The individual signal terminals may then be formed by bending, folding or otherwise manipulating the signal terminals 26 to give the signal terminals 26 a final shape. Once formed, the first and second sides 120, 122 may not necessarily be parallel to one another.

The mounting contacts 30 are the portions of the signal terminals 26 extending from the mounting face 42 of the contact modules 22 (both shown in FIG. 1). The mounting contacts 30 are received within the vias 54. The mounting contacts 30 include a mounting portion 130 and a transition portion 132. The mounting portion 130 engages the electrical conductor 98, and is thus electrically connected to the mounting pad 102 within the corresponding via 54. In the illustrated embodiment, the mounting portion 130 is represented by an eye-of-the-needle contact. The length of the mounting portion 130 is slightly longer than the electrical conductor 98 to ensure electrical contact thereto.

The transition portion 132 extends between the mounting face 42 and the mounting portion 130. The transition portion 132 is generally offset with respect to the mounting portion 130. In the illustrated embodiment, the transition portions 132 of the pair of signal terminals 26 are offset toward one another relative to the mounting portions 130. The amount of offset is established to control the impedance of the signal terminals 26 and/or cross-talk between the signal terminals 26 and neighboring traces 104. In the illustrated embodiment, the transition portions 132 are offset away from the neighboring traces 104, such as to reduce cross-talk between the signal terminals 26 and the neighboring traces 104. The transition portions 132 are offset toward one another, such as to decrease impedance of the signal terminals 26. The decrease in impedance may be necessary due to the large amount of air introduced by the large bore of the via 54.

The larger diameter portions 96 of the vias 54 provide space for the transition portions 132 to be offset from the via axes 106. For example, while the mounting portions 130 are aligned with the via axes 106, parts of the transition portions 132 are aligned vertically above the shoulder 108, which would not be possible without the oversized counterboring process. In an exemplary embodiment, the larger diameter portions 96 are filled with air, which has a dielectric constant of approximately 1.0, as opposed to the material of the circuit board 12, which may be FR-4 having a dielectric constant of approximately 4.3. The air surrounding the mounting contacts 30 affects the electrical characteristics of the mounting contacts 30, such as by affecting the interactions between the adjacent mounting contacts 30 and/or by affecting the interactions between the mounting contacts 30 and the neighboring traces 104.

In an exemplary embodiment, the signal terminals 26 define signal propagation paths through the circuit board 12, and the signal terminals 26 are oriented such that the signal terminals 26 are offset from the via axes 106 along a majority of the signal propagation paths. The signal terminals 26 each have a terminal axis 134 defined at a cross-sectional center of the signal terminals 26 along the length of the signal terminals 26. The cross-sectional center is the center of gravity of the signal terminal 26 along any given cross-section taken along the length of the signal terminal 26. The length of the signal terminal 26 is defined as the longitudinal length of the signal terminal 26 (e.g. between the mounting contact 30 and the mating contact 32 (shown in FIG. 1)). The terminal axes 134 of the signal terminals 26 of each pair are offset with respect to the corresponding via axes 106 along a majority of the signal terminals 26 within the vias 54. Optionally, the terminal axes 134 along the mounting portions 130 are generally coincident with the via axes 106, while the terminal axes 134 along the transition portions 132 are non-coincident with the via axes 106. The terminal axes 134 of the transition portions 132 are offset with respect to the terminal axes 134 of the mounting portions 130. The amount of offset is selected to control the electrical characteristics of the signal terminals 26.

Intrapair and interpair interactions can be understood with reference to FIG. 5, which illustrates an intrapair interaction zone 140 and an interpair interaction zone 142. The intrapair interaction zone 140 is generally provided between the signal terminals 26 within a differential pair. The interpair interaction zone 142 is generally provided between the signal terminals 26 and the neighboring traces 104. With the counterboring of the plating and surrounding material of the circuit board 12 down to the vicinity of the mounting pads 102, a large air gap is provided around each signal terminal 26. The large air gap affects the intrapair coupling in the intrapair interaction zone 140, such as by raising the impedance. However, depending on the diameter of the bore, the air gap may raise the impedance above the desired level (e.g. 100 Ohms), which may cause signal degradation. By having the transition portions 132 shifted toward one another, the impedance may be lowered to the desired level (e.g. 100 Ohms, however other levels are possible in alternative embodiments depending on the particular application). The shape of the mounting contacts 30, particularly in the transition portions 132, may be selected to obtain the desired impedance. As such, intrapair coupling in the intrapair interaction zone 140 may be controlled by selecting the shape and spacing of the mounting contacts 30 within each differential pair.

With the counterboring of the plating down to the vicinity of the mounting pads 106, a large air gap is provided around each signal terminal 26. The large air gap affects the interpair coupling in the interpair interaction zone 142, such as by lowering trace-to-terminal crosstalk. The introduction of air between the traces 104 and the mounting contacts 30 helps reduce crosstalk therebetween because air has a lower dielectric constant than the circuit board 12 material. Additionally, by having the transition portions 132 shifted away from the traces 140, the trace-to-terminal crosstalk may be further reduced as compared to a situation in which the transition portions 132 were not shifted. As such, interpair coupling in the interpair interaction zone 142 may be controlled by orienting each mounting contact 30 in a particular location relative to the neighboring traces 104. Furthermore, by having the cut sides 124 facing the neighboring traces 104, as opposed to the first and second sides 120, 122, a narrower portion of the signal terminals 26 faces the neighboring traces 104, which may also reduce trace-to-terminal cross-talk.

In the illustrated embodiment, the mounting contacts 30 are stamped and formed in a predetermined manner to provide predetermined electrical characteristics. For example, the mounting contacts 30 are formed and positioned with respect to one another and the neighboring traces 104 to control impedance between the signal traces 26 of the differential pair and to control cross-talk with neighboring traces 104. The mounting contacts 30 are stamped with the centerlines of the transition portions 132 being non-coincident with the centerlines of the mounting portions 130. The centerlines are staggered or shifted with respect to one another such that the transition portions 132 of the signal terminals 26 within each pair are shifted toward one another with respect to the mounting portions 130 of the signal terminals 26 within each pair.

In an exemplary embodiment, the transition portions 132 also include a folded over portion 136 along at least a portion of the length of the transition portion 132. The folded over portion 136 is defined during the forming process. The folded over portion 136 defines a strengthening rib, and may be referred to hereinafter as a strengthening rib 136. The strengthening rib 136 provides rigidity to the transition portion 132 and helps prevent buckling of the mounting contact 130 during mounting of the receptacle connector 16 to the circuit board 12. Optionally, the strengthening rib 136 may be formed by other methods or processes other than folding over the mounting portion 130, including being a separate piece that is attached to the mounting portion 130.

Figure 6:
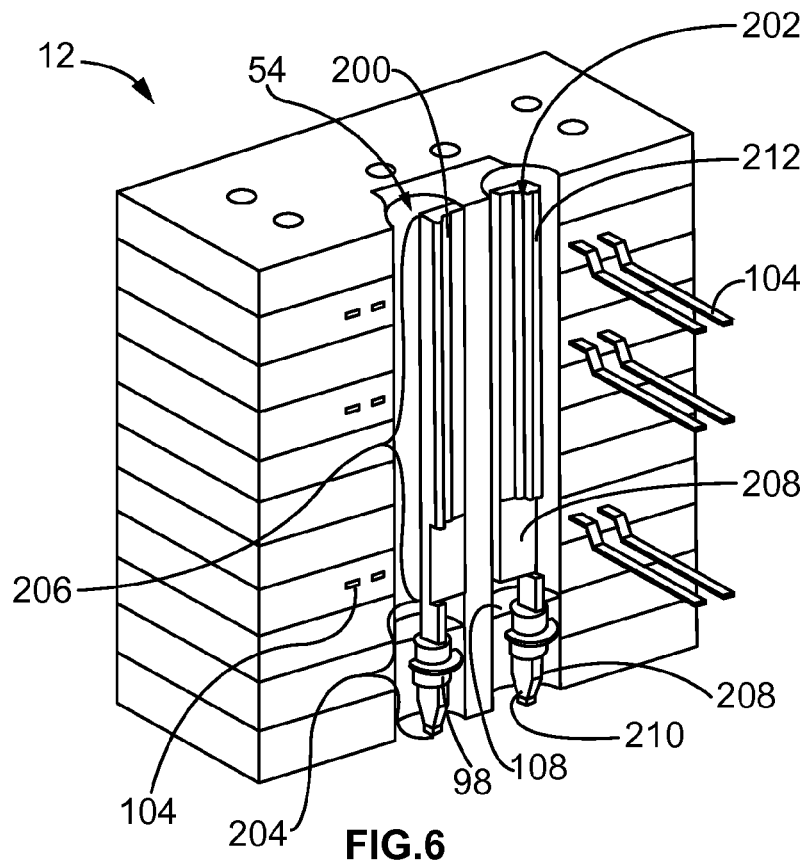
FIG. 6 is a partial cut-away view of the circuit board shown in FIG. 2 illustrating alternative signal terminals mounted to the circuit board.
Figure 7:
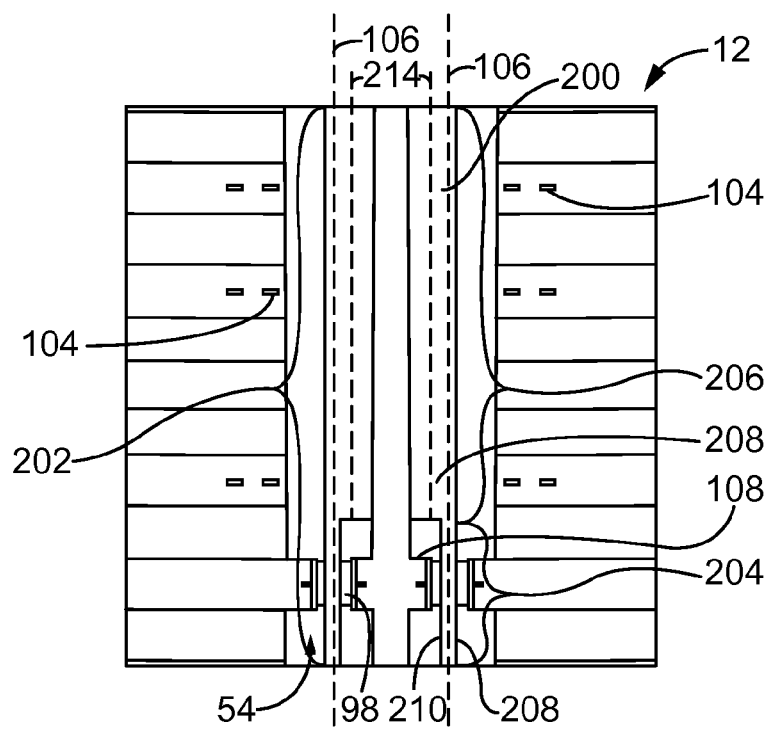
FIG. 7 is a side view of the circuit board and signal terminals shown in FIG. 6.

FIG. 6 is a partial cut-away view of the circuit board 12 illustrating alternative signal terminals 200 mounted to the circuit board 12. FIG. 7 is a side view of the circuit board 12 and signal terminals 200. Mounting contacts 202 of the signal terminals 200 are the only portions of the signal terminals 200 illustrated in FIGS. 6 and 7.

The mounting contacts 202 include mounting portions 204 and transition portions 206 extending from the mounting portions 204. The mounting contacts 202 are received within the vias 54 such that the mounting portions 204 engage the electrical conductor 98. The mounting contacts 202 differ from the mounting contacts 30 (shown in FIGS. 4 and 5) in that the mounting portions 204 are not co-planar with the transition portions 206. In contrast, the transition portions 206 are twisted approximately 90° with respect to the mounting portions 204. In an exemplary embodiment, the mounting contacts 202 are stamped with the other portions of the signal terminal 200 to define a first side 208 and a second side 210. Either the mounting portion 204 or the transition portion 206 of each signal terminal 200 is twisted after the stamping process during a forming process. Once twisted, the first sides 208 of the transition portions 206 are generally perpendicular with respect to the first sides 208 of the mounting portions 204. The transition portion 206 is also formed by folding over a segment thereof to form a strengthening rib 212.

The twisting of the mounting contact 202 causes the transition portion 206 to be offset with respect to the mounting portion 204. In the illustrated embodiment, the transition portions 206 of the pair of signal terminals 200 are offset toward one another relative to the mounting portions 204. The amount of offset is established to control the impedance of the signal terminals 200. In the illustrated embodiment, the transition portions 206 are offset away from the neighboring traces 104, such as to reduce cross-talk between the signal terminals 200 and the neighboring traces 104. The mounting contacts 202 are positioned within the vias 54 such that part of each transition portion 206 is aligned vertically above the shoulder 108.

The signal terminals 200 are oriented such that the signal terminals 200 are offset from the via axes 106 (shown in FIG. 7) along a majority of the signal propagation paths. The signal terminals 200 each have a terminal axis 214 (shown in FIG. 7) defined at a cross-sectional center of the signal terminals 200. The terminal axes 214 of the signal terminals 200 of each pair are offset with respect to the corresponding via axes 106 along a majority of the signal terminals 200 within the vias 54. Optionally, the terminal axes 214 along the mounting portions 204 are generally coincident with the via axes 106, while the terminal axes 214 along the transition portions 206 are non-coincident with the via axes 106. The terminal axes 214 of the transition portions 206 are offset with respect to the terminal axes 214 of the mounting portions 204. The amount of offset is selected to control the electrical characteristics of the signal terminals 200.

Figure 8:
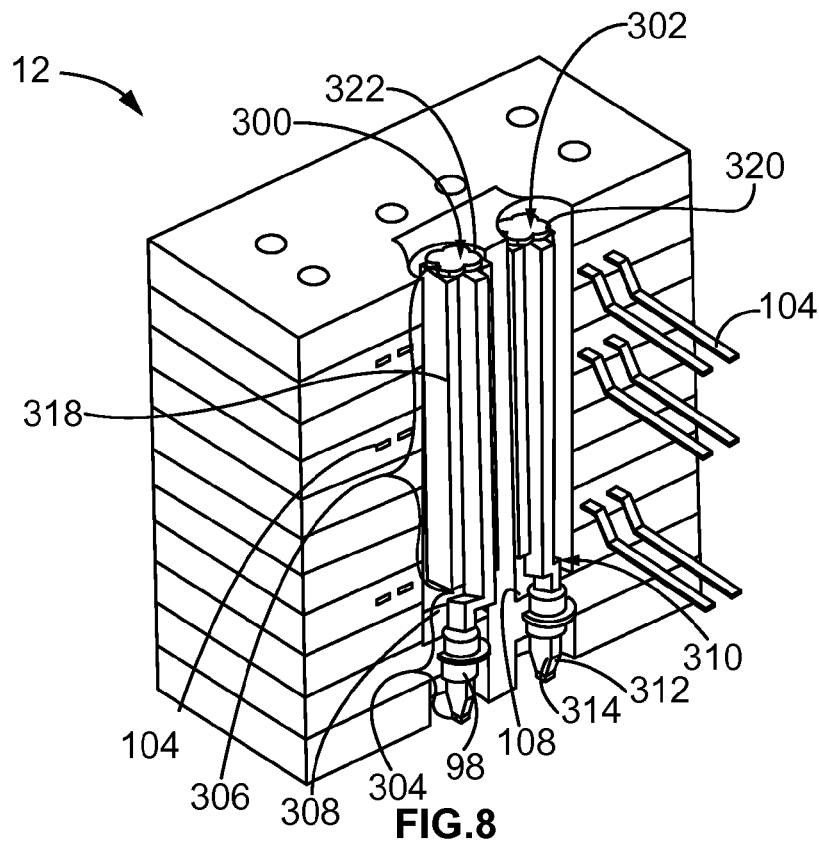
FIG. 8 is a partial cut-away view of the circuit board shown in FIG. 2 illustrating alternative signal terminals mounted to the circuit board.
Figure 9:
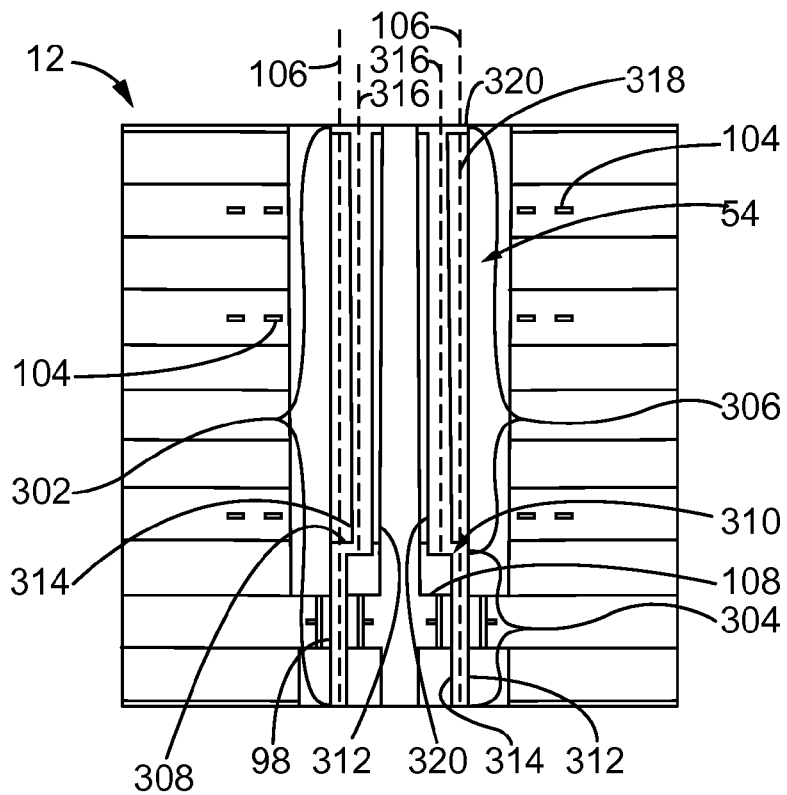
FIG. 9 is a side view of the circuit board and signal terminals shown in FIG. 8.

FIG. 8 is a partial cut-away view of the circuit board 12 illustrating alternative signal terminals 300 mounted to the circuit board 12. FIG. 9 is a side view of the circuit board 12 and signal terminals 300. Mounting contacts 302 of the signal terminals 300 are the only portions of the signal terminals 300 illustrated in FIGS. 8 and 9.

The mounting contacts 302 include mounting portions 304 and transition portions 306 extending from the mounting portions 304. The mounting contacts 302 are received within the vias 54 such that the mounting portions 304 engage the electrical conductor 98. The mounting contacts 302 differ from the mounting contacts 30 (shown in FIGS. 4 and 5) in that the mounting portions 304 are not co-planar with the transition portions 306. The transition portions 306 are bent at approximately 90° at the mounting portions 304 to define a ledge 308, and then the transition portions 306 are again bent at approximately 90°. The double bend maintains the transition portions 306 generally parallel to, but offset from, the mounting portions 304. The double bend creates a jogged section 310 in the mounting contact 302. In an exemplary embodiment, the mounting contacts 302 are stamped with the other portions of the signal terminal 300 to define a first side 312 and a second side 314. The first sides 312 of the mounting portions 304 are parallel to the first sides 312 of the transition portions 306. The second sides 314 of the mounting portions 304 are parallel to the second sides 314 of the transition portions 306. The jogged section 310 is defined during a forming process by bending the signal terminal 300. Alternatively, rather than stamping and forming the signal terminals 300, the signal terminals 300 may be molded or cast into the illustrated form.

The jogged section 310 of the mounting contact 302 causes the transition portion 306 to be offset with respect to the mounting portion 304. In the illustrated embodiment, the transition portions 306 of the pair of signal terminals 300 are offset toward one another relative to the mounting portions 304. The amount of offset is established to control the impedance of the signal terminals 300. In the illustrated embodiment, the transition portions 306 are offset away from the neighboring traces 104, such as to reduce cross-talk between the signal terminals 300 and the neighboring traces 104. The mounting portions 302 are positioned within the vias 54 such that part of each transition portion 306 is aligned vertically above the shoulder 108.

The signal terminals 300 are oriented such that the signal terminals 300 are offset from the via axes 106 along a majority of the signal propagation paths. The signal terminals 300 each have a terminal axis 316 defined at a cross-sectional center of the signal terminals 300. The terminal axes 316 of the signal terminals 300 of each pair are offset with respect to the corresponding via axes 106 along a majority of the signal terminals 300 within the vias 54. Optionally, the terminal axes 316 along the mounting portions 304 are generally coincident with the via axes 106, while the terminal axes 316 along the transition portions 306 are non-coincident with the via axes 106. The terminal axes 316 of the transition portions 306 are offset with respect to the terminal axes 316 of the mounting portions 304. The amount of offset is selected to control the electrical characteristics of the signal terminals 300.

In an exemplary embodiment, a dielectric support collar 318 at least partially surrounds the transition portion 306. The support collar 318 supports the transition portion 306, such as to prevent buckling. The support collar 318 may rest upon the ledge 308 and extend to a top ledge 320 of the transition portion 306. The support collar 318 may abut against the wall of the via 54 to hold the mounting contact 302 in position within the via 54. Optionally, the transition portion 306 may include a support rib 322 in addition to, or in lieu of, the support collar 318.

The embodiments described and/or illustrated herein provide an electrical connector that may enable improvement of the density and/or electrical performance of circuit board footprints to achieve higher system densities and/or higher system speeds. For example, the embodiments described and/or illustrated herein, when left at the same density as at least some known systems, may decrease via to via coupling and may increase circuit board footprint impedance. Alternatively, the embodiments described and/or illustrated herein may be able to achieve higher footprint densities than at least some known systems while maintaining the same via to via coupling and impedance levels of such known systems. The embodiments described and/or illustrated herein may provide improved electrical characteristics between signal terminals of the electrical connector.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means—plus-function format and are not intended to be interpreted based on 35 U.S.C. §112, sixth paragraph, unless and until such claim limitations expressly use the phrase "means for" followed by a statement of function void of further structure.

What is claimed is:

1. An electrical connector assembly comprising:
a circuit board comprising vias each extending at least partially through the circuit board along parallel via axes; and
an electrical connector mounted on the circuit board, the electrical connector comprising a plurality of variable depth signal terminals configured to extend different depths into respective vias of the circuit board, the signal terminals each having a terminal axis, the signal terminals being arranged in pairs carrying differential pair signals, the signal terminals of each pair extending to the same depth in the respective vias of the circuit board, wherein the terminal axes of the signal terminals of each pair are offset with respect to the corresponding via axes along a majority of the signal terminals within the vias.

2. The assembly of claim 1, wherein the signal terminals include a mounting portion and a transition portion, the terminal axes along the mounting portions being coincident with the via axes, the terminal axes along the transition portions being non-coincident with the via axes.

3. The assembly of claim 1, wherein the terminal axes of the signal terminals of each differential pair are offset from the via axes generally toward one another by an amount configured to provide a selected impedance for the contacts of the differential pair.

4. The assembly of claim 1, wherein the signal terminals define signal propagation paths through the circuit board, the signal terminals being offset from the via axes along a majority of the signal propagation paths.

5. The assembly of claim 1, wherein each via includes a mounting pad, and wherein each via includes a smaller diameter portion and a larger diameter portion with a shoulder defined between the smaller and larger diameter portions, the smaller diameter portion being plated and being electrically connected to the corresponding mounting pad, the signal terminals having transition portions being arranged within the larger diameter portions and being aligned vertically above the shoulders.

6. The assembly of claim 1, wherein each via includes a mounting pad, and wherein each signal terminal includes a mounting portion being electrically connected to the corresponding mounting pad and each signal terminal having a transition portion extending from the mounting portion, the transition portion being twisted at a right angle with respect to the mounting portion.

7. The assembly of claim 1, wherein each via includes a mounting pad, and wherein each signal terminal includes a mounting portion being electrically connected to the corresponding mounting pad and each signal terminal having a transition portion extending from the mounting portion, the terminal axes along the transition portions being non-coincident with the via axes, the transition portions including a strengthening rib extending along a majority of the length of the transition portion.

8. The assembly of claim 1, wherein each via includes a mounting pad, and wherein each signal terminal includes a mounting portion electrically connected to the corresponding mounting pad and each signal terminal having a transition portion extending from the mounting portion, the terminal axes along the transition portions being non-coincident with the via axes, the assembly further comprising a dielectric support collar surrounding the transition portion.

9. The assembly of claim 1, wherein each via includes a mounting pad, and wherein each signal terminal includes a mounting portion electrically connected to the corresponding mounting pad and each signal terminal having a transition portion extending from the mounting portion, the mounting portions and the transition portions being generally coplanar with one another, the transition portions of the signal terminals within each pair being shifted toward one another with respect to the mounting portions of the signal terminals within each pair.

10. An electrical connector assembly comprising:
a circuit board comprising vias each extending at least partially through the circuit board along parallel via axes, each via having a mounting pad; and
an electrical connector mounted on the circuit board, the electrical connector comprising:
a housing having a mounting face configured to be mounted along the circuit board; and
a plurality of signal terminals held by the housing, the signal terminals each comprising mounting contacts extending outward from the mounting face of the housing, the mounting contacts being received in respective vias of the circuit board, the mounting contacts each having a mounting portion engaging the mounting pad within the corresponding via, the mounting contacts each having a transition portion extending between the mounting face of the housing and the mounting portion of the mounting contact, the transition portion being offset with respect to the mounting portion.

11. The assembly of claim 10, wherein the signal terminals each have a terminal axis defined at a cross-sectional center of the signal terminals along the length of the signal terminals, the terminal axis of the transition portion being offset with respect to the terminal axis of the mounting portion.

12. The assembly of claim 10, wherein the signal terminals each have a terminal axis defined at a cross-sectional center of the signal terminals along the length of the signal terminals, the terminal axes along the mounting portions being coincident with the via axes, the terminal axes along the transition portions being non-coincident with the via axes.

13. The assembly of claim 10, wherein the signal terminals define signal propagation paths through the circuit board, the signal terminals being offset from the via axes along a majority of the signal propagation paths.

14. The assembly of claim 10, wherein each via includes a smaller diameter portion and a larger diameter portion with a shoulder defined between the smaller and larger diameter portions, the smaller diameter portion being plated and being electrically connected to the corresponding mounting pad, the transition portions being arranged within the larger diameter portions and being aligned vertically above the shoulders.

15. The assembly of claim 10, wherein the transition portion is twisted at a right angle with respect to the mounting portion.

16. The assembly of claim 10, wherein the mounting contacts are generally planar with the mounting portions and the transition portions being coplanar, the signal terminals being arranged in pairs carrying differential signals, the transition portions of signal terminals within each pair being shifted toward one another with respect to the mounting portions of signal terminals within each pair.

17. The assembly of claim 10, further comprising a dielectric support collar surrounding the transition portion.

18. An electrical connector for mounting on a circuit board having vias, the electrical connector comprising:
   a housing having a mounting face configured to be mounted along the circuit board; and
   a plurality of variable depth signal terminals held by the housing, the signal terminals being configured to extend different depths into respective vias of the circuit board, the signal terminals being arranged in pairs carrying differential pair signals, the signal terminals of each pair extending to the same depth in the respective vias of the circuit board, the signal terminals each having a terminal axis defined at a cross-sectional center of the signal terminals along the length of the signal terminals, the signal terminals comprising mounting contacts extending outward from the mounting face of the housing, each mounting contact having a mounting portion and a transition portion extending between the mounting face of the housing and the mounting portion of the mounting contact, the terminal axis of the transition portion being offset with respect to the terminal axis of the mounting portion.

19. The electrical connector of claim 18, wherein the terminal axes along the mounting portions are coincident with a central via axes of the corresponding via, and wherein the terminal axes along the transition portions are non-coincident with the central via axes of the corresponding via.

20. The electrical connector of claim 18, wherein the signal terminals define signal propagation paths through the circuit board, the signal terminals being offset from central via axes of the corresponding vias along a majority of the signal propagation paths.

\* \* \* \* \*